United States Patent
Leskowitz et al.

(10) Patent No.: US 9,341,690 B2
(45) Date of Patent: May 17, 2016

(54) POLE PIECE

(71) Applicant: Nanalysis Corporation, Calgary (CA)

(72) Inventors: Garett M. Leskowitz, Calgary (CA);
Gregory McFeetors, Calgary (CA)

(73) Assignee: NANALYSIS CORP., Calgary (CA)

(*) Notice: Subject to any disclaimer, the term of this patent is extended or adjusted under 35 U.S.C. 154(b) by 405 days.

(21) Appl. No.: 13/761,958

(22) Filed: Feb. 7, 2013

(65) Prior Publication Data

US 2013/0207657 A1    Aug. 15, 2013

Related U.S. Application Data

(60) Provisional application No. 61/597,430, filed on Feb. 10, 2012.

(51) Int. Cl.
| | |
|---|---|
| *G01V 3/00* | (2006.01) |
| *G01R 33/38* | (2006.01) |
| *H01F 7/02* | (2006.01) |
| *G01R 33/383* | (2006.01) |
| *G01R 33/3873* | (2006.01) |

(52) U.S. Cl.
CPC .............. *G01R 33/38* (2013.01); *G01R 33/383* (2013.01); *G01R 33/3873* (2013.01); *H01F 7/02* (2013.01); *H01F 7/0284* (2013.01)

(58) Field of Classification Search
CPC .................................................. G01R 33/3873
USPC .................................. 324/320, 319; 335/296
See application file for complete search history.

(56) References Cited

U.S. PATENT DOCUMENTS

| 3,182,231 | A | | 5/1965 | Gang et al. | |
|---|---|---|---|---|---|
| 4,656,449 | A | * | 4/1987 | Mallard et al. | 335/297 |
| 5,003,276 | A | * | 3/1991 | Sarwinski et al. | 335/304 |
| 5,134,374 | A | | 7/1992 | Breneman | |
| 5,431,165 | A | * | 7/1995 | Sellers | 600/422 |
| 5,436,607 | A | | 7/1995 | Chari | |
| 6,255,928 | B1 | * | 7/2001 | van Oort et al. | 335/301 |
| 6,275,129 | B1 | | 8/2001 | Van Oort | |
| 7,646,274 | B2 | * | 1/2010 | Rapoport | 335/296 |

(Continued)

FOREIGN PATENT DOCUMENTS

| JP | S62250608 | 10/1987 |
|---|---|---|
| JP | S63266804 | 11/1988 |
| JP | H02248008 | 10/1990 |

(Continued)

OTHER PUBLICATIONS

Chunli Wu et al.: "Optimal Design and Test of main Magnet in Superconducting MRI", IEE Transactions on Applied Los Alamitos, CA, US, vol. 20, No. 3, May 28, 2010, pp. 1810-1813.

(Continued)

*Primary Examiner* — Louis Arana
(74) *Attorney, Agent, or Firm* — Michael G. Johnston; Moore & Van Allen PLLC

(57) ABSTRACT

There are disclosed pole piece designs. In embodiments a pole piece comprises a rear face, the rear face comprising at least one channel. In embodiments the pole piece comprises at least one hole for accepting a cooperating shimming rod. There are also disclosed magnet arrays and magnetic resonance apparatuses comprising the pole pieces as well as uses of the pole pieces with magnet arrays according to embodiments.

26 Claims, 11 Drawing Sheets

(56) References Cited

U.S. PATENT DOCUMENTS

2005/0085712 A1  4/2005  Rapoport
2011/0137589 A1  6/2011  Leskowitz et al.

FOREIGN PATENT DOCUMENTS

| JP | H04307706 | 10/1992 |
| JP | H05243037 | 9/1993 |
| JP | 2001224570 | 8/2011 |
| WO | WO 0155732 | 8/2001 |
| WO | WO 2011001429 | 1/2011 |

OTHER PUBLICATIONS

European Search Report 13746375.8 (May 27, 2015).

* cited by examiner

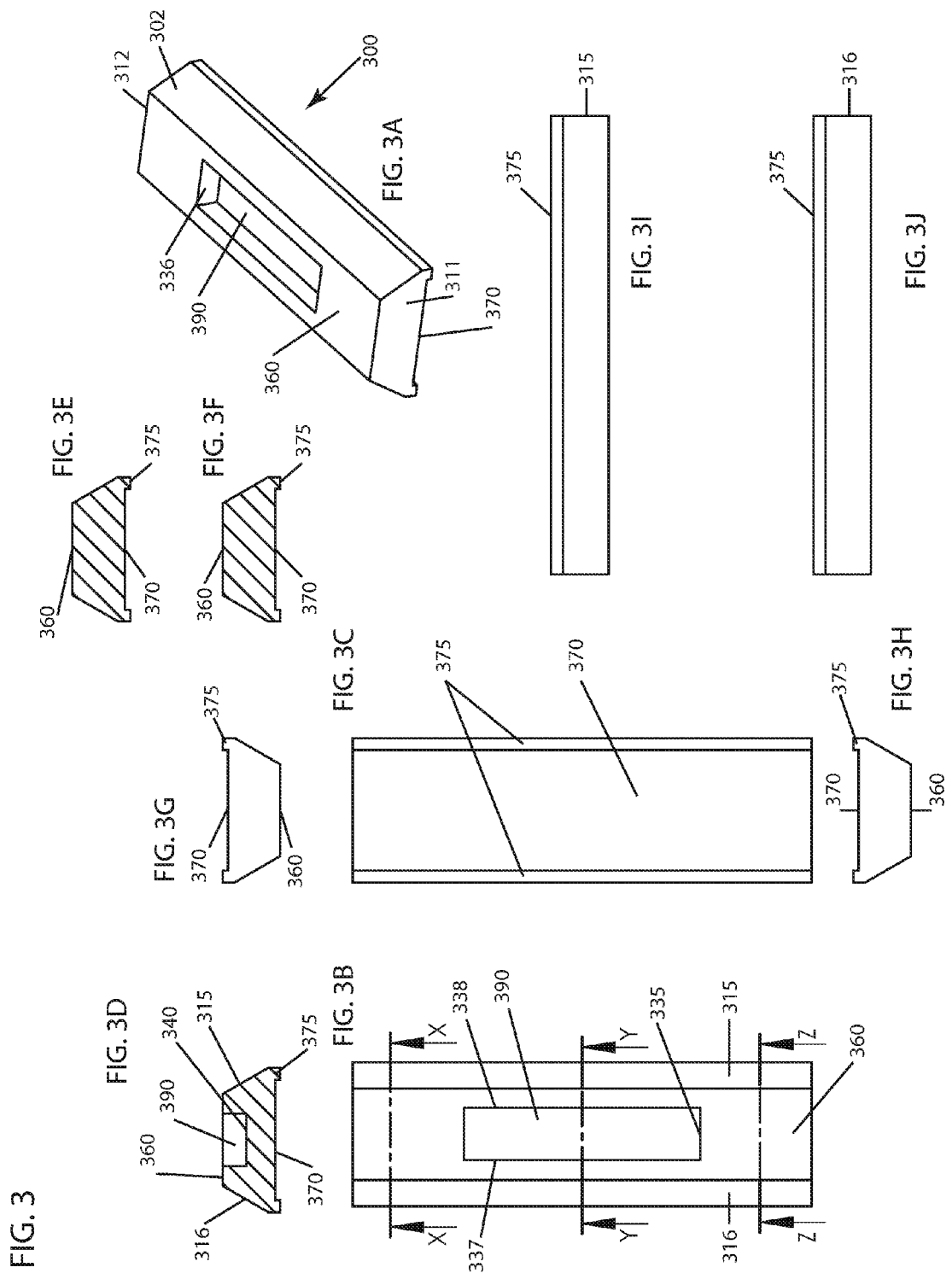

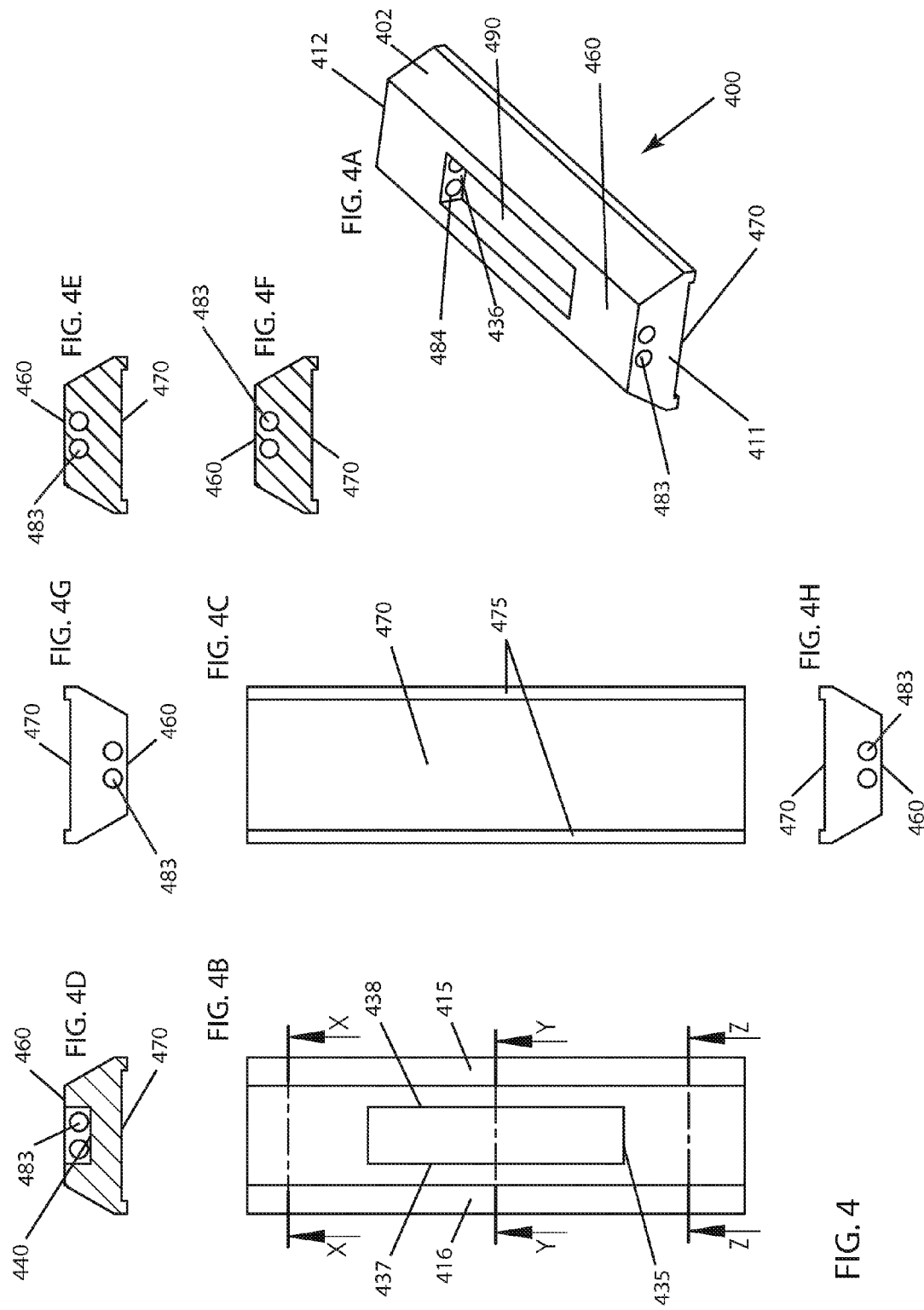

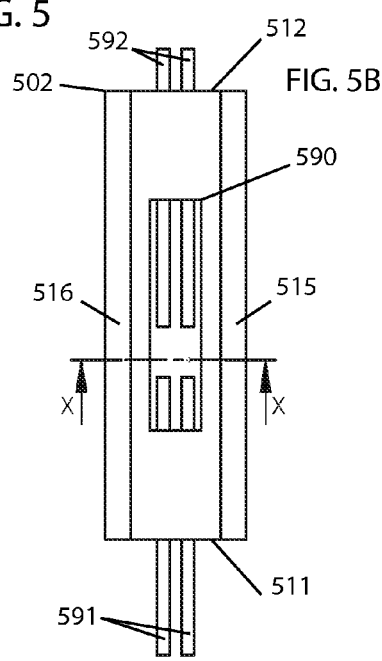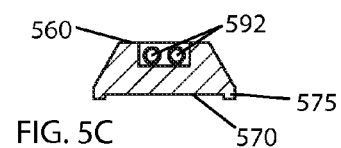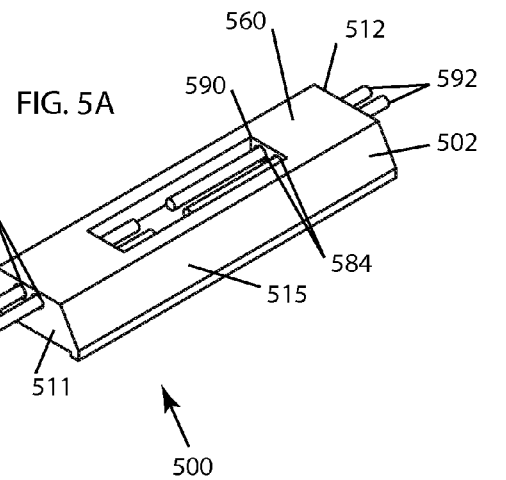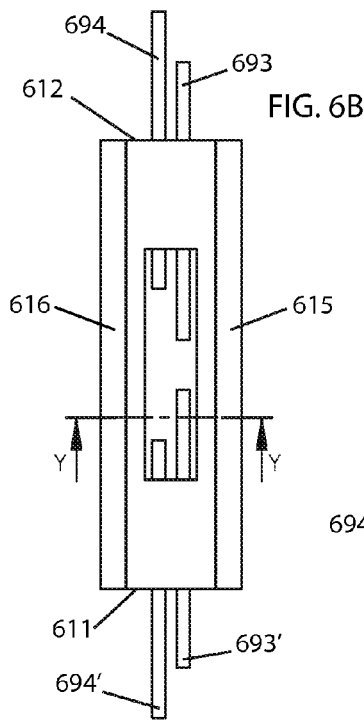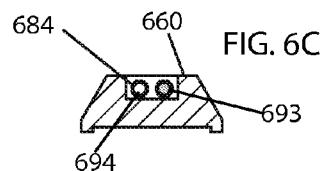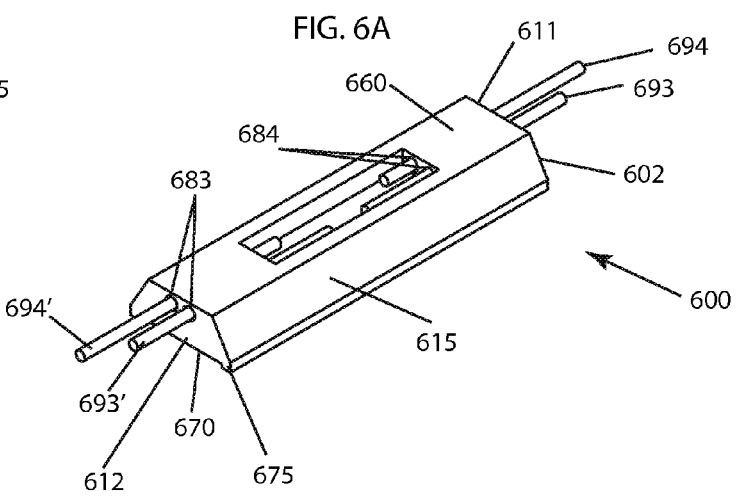

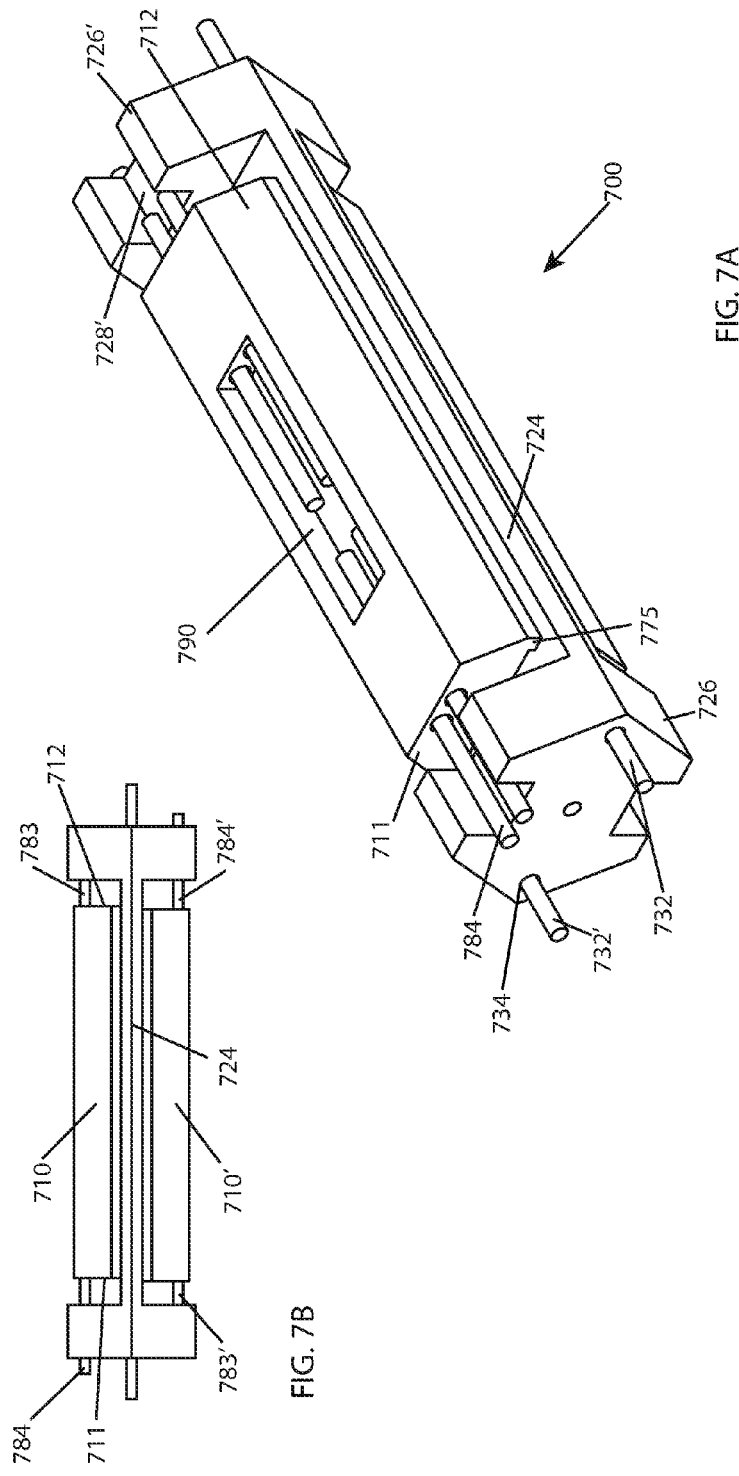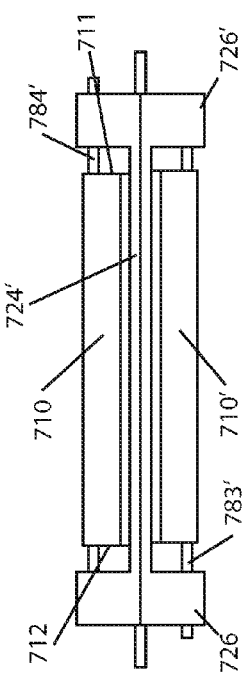

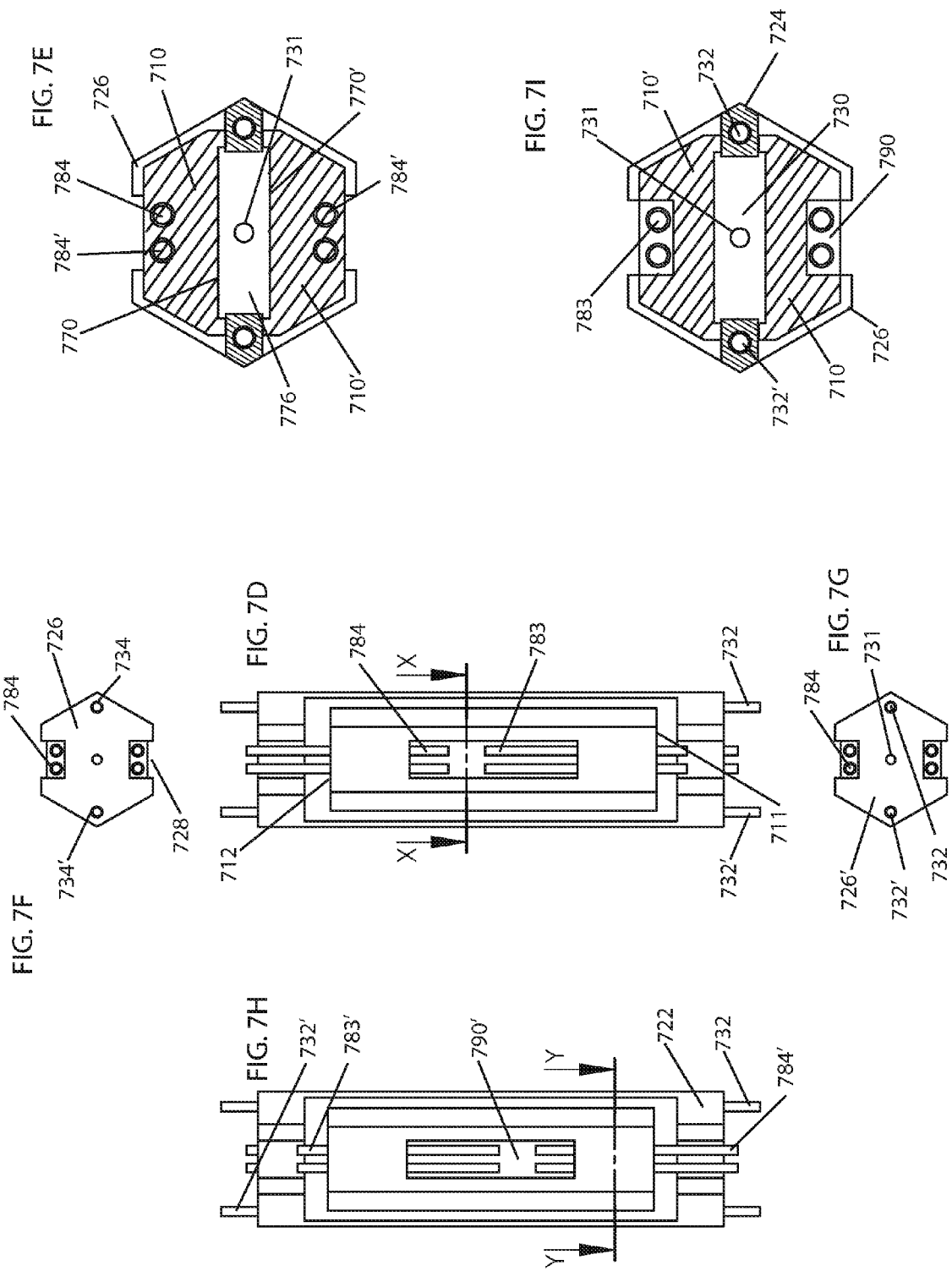

FIG. 8
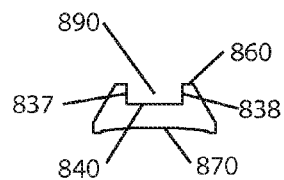
FIG. 8A
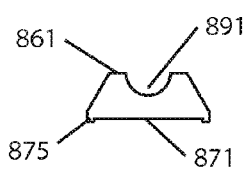
FIG. 8B
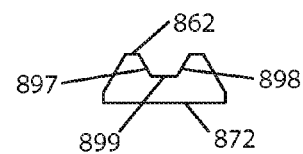
FIG. 8C
FIG. 9
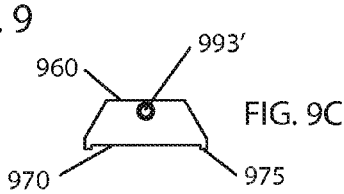
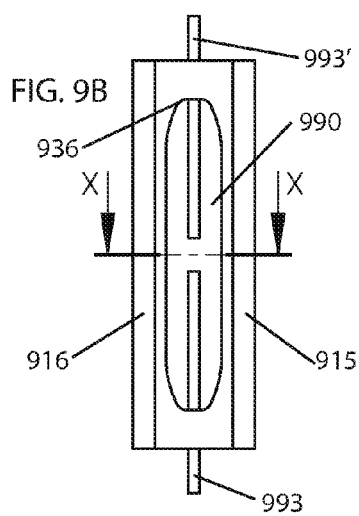
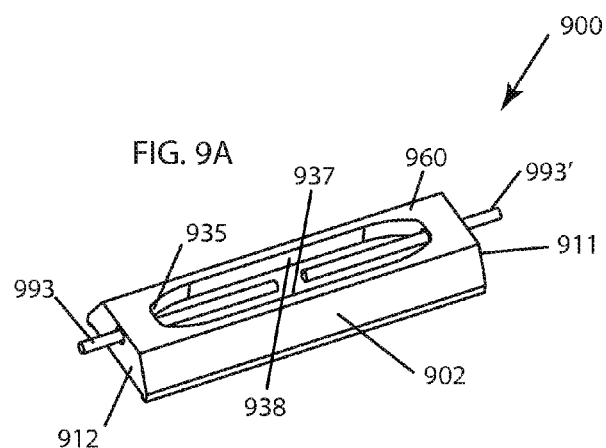
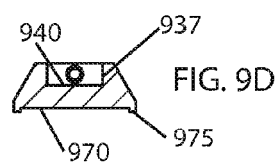

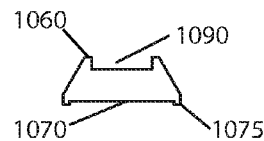
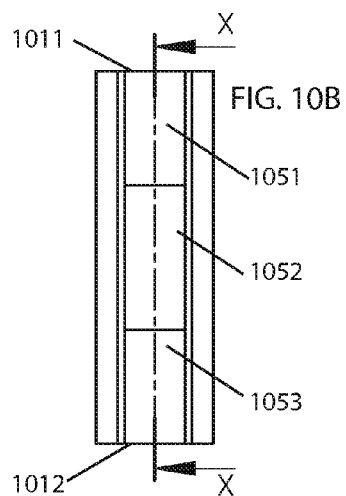
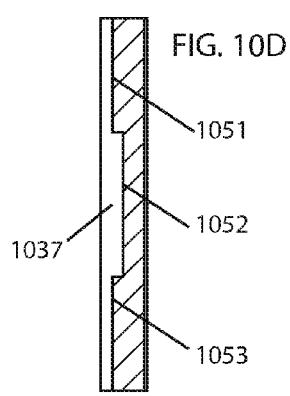
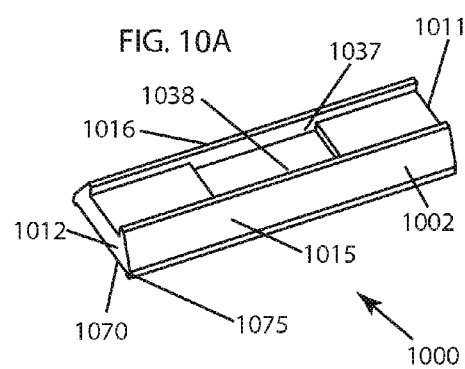
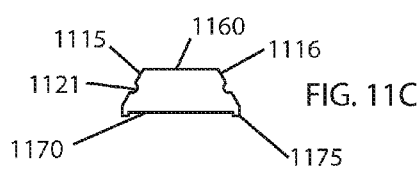
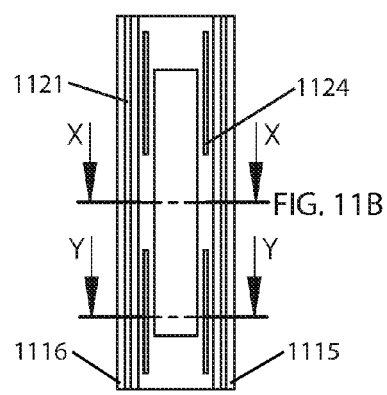
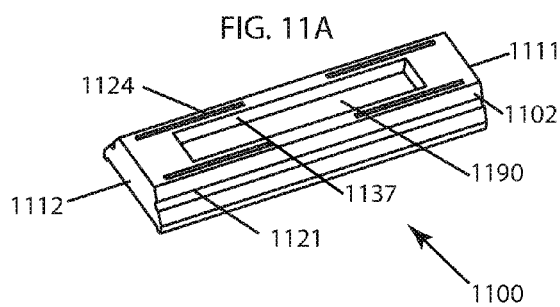
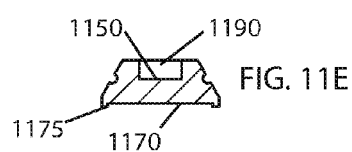

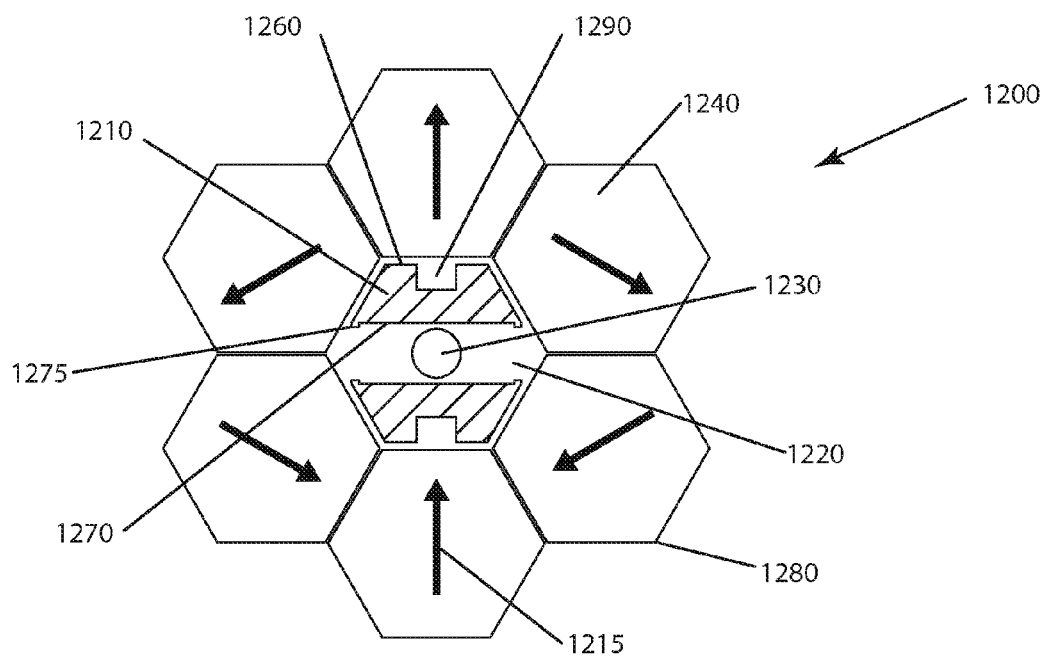
FIG. 12
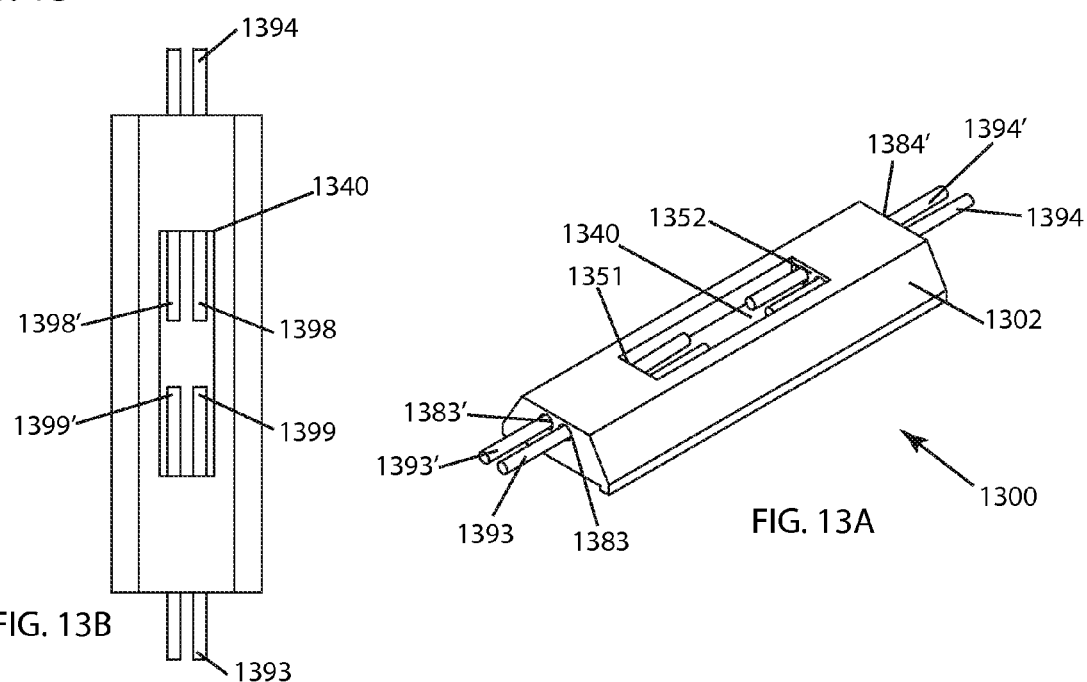
FIG. 13
FIG. 13A
FIG. 13B

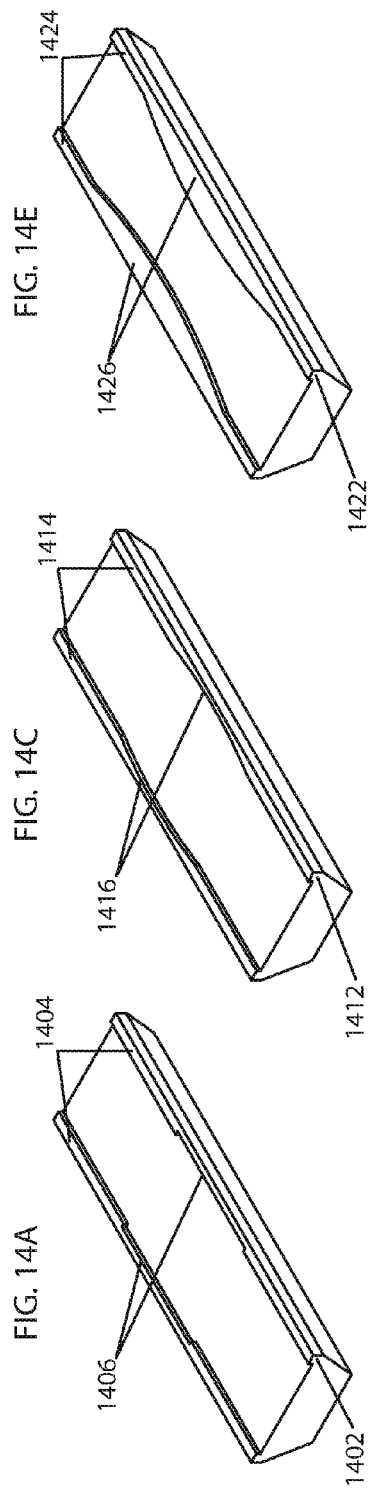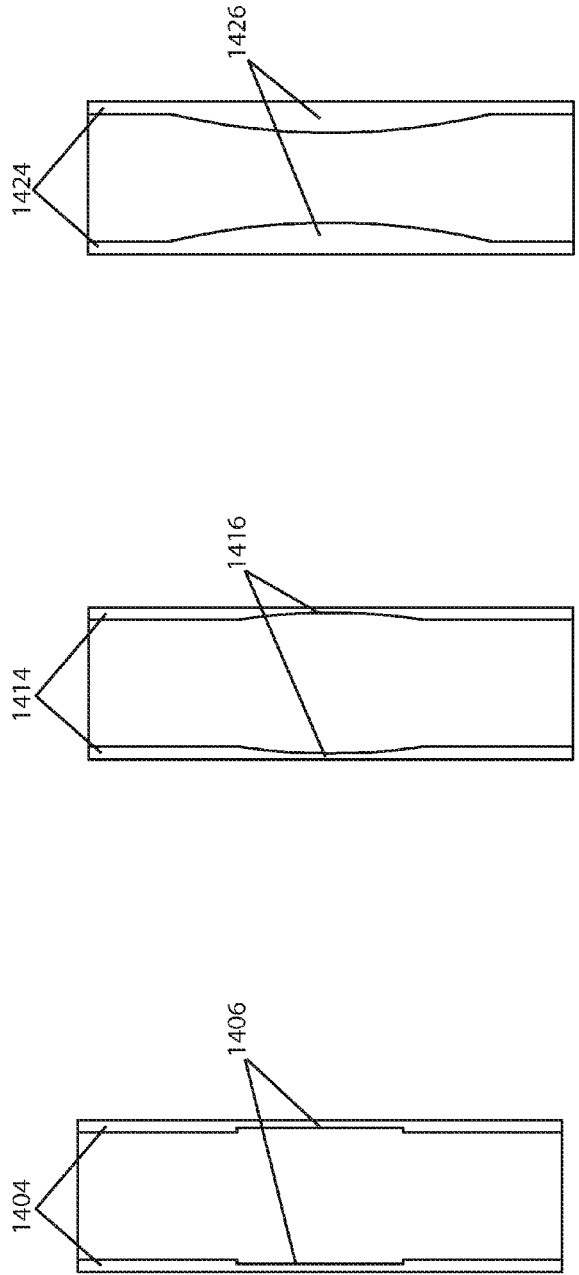

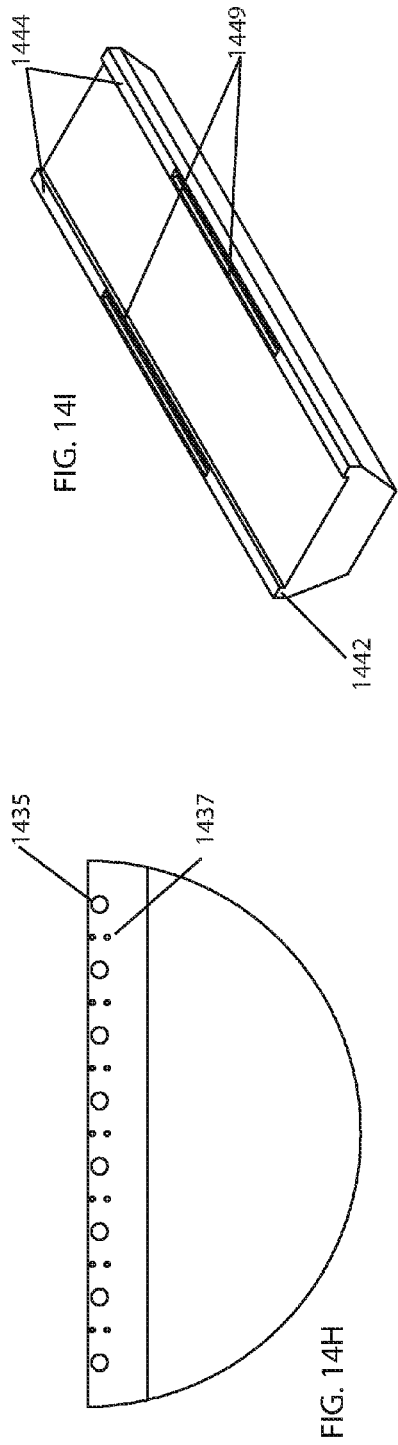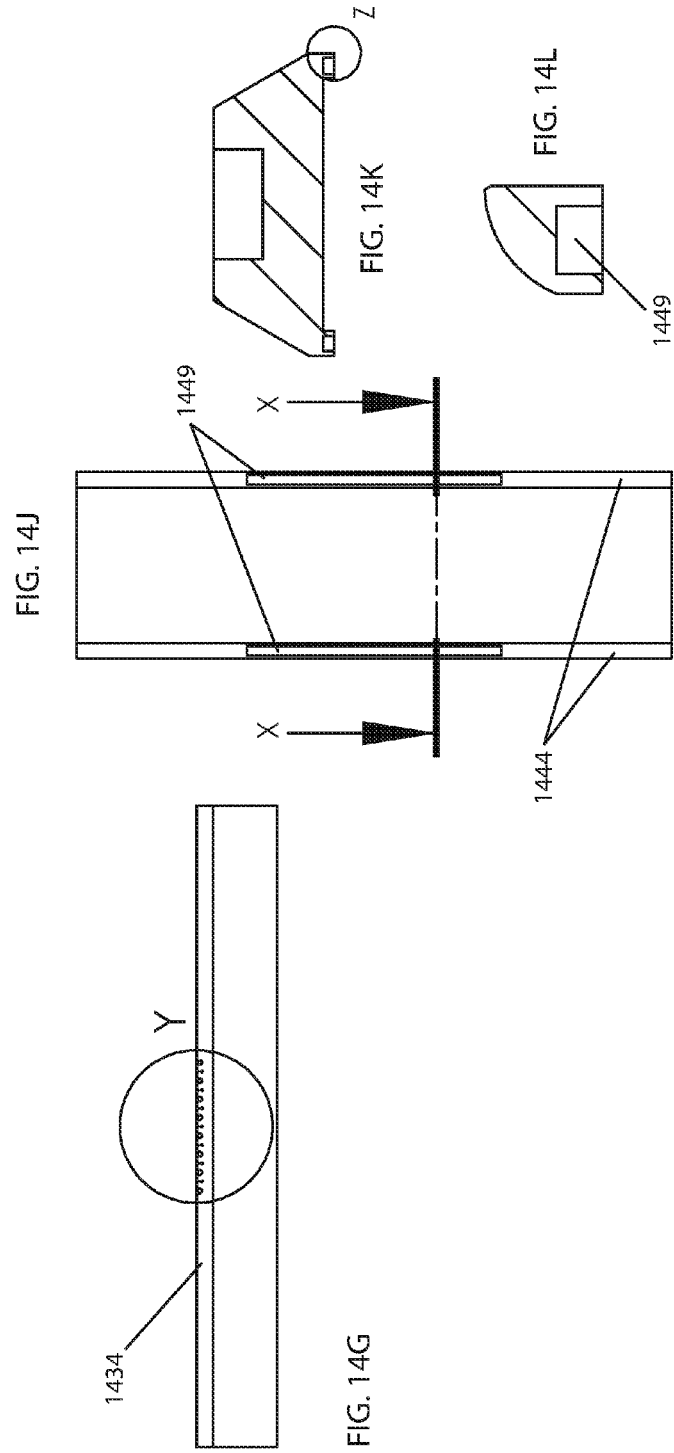

POLE PIECE

CROSS REFERENCE TO RELATED APPLICATION

This application claims the benefit of priority under 35 U.S.C. §119(e) to the filing date of U.S. Provisional Application 61/597,430 filed on Feb. 10, 2012, which is incorporated herein by reference in its entirety.

FIELD

The subject matter hereof relates to pole pieces and uses thereof.

REFERENCES CITED

Relevant background documents include:
1. Ernst, R. R., Bodenhausen, G., and Wokaun, A., Principles of Nuclear Magnetic Resonance in One and Two Dimensions, International Series of Monographs on Chemistry—14, Oxford University Press, 1990.
2. Halbach, K., "Design of Permanent Multipole Magnets with Oriented Rare Earth Cobalt Material," Nuclear Instruments and Methods 169, 1-10, 1980.
3. Moresi, G. and Magin, R., "Miniature Permanent Magnet for Tabletop NMR," Concepts in Magnetic Resonance Part B: Magnetic Resonance Engineering 19B (1), 35-43, 2003.
4. Rose, N. E., "Magnetic Field Correction in the Cyclotron," Physical Review 53, 715-719, 1938.
5. Hamermesh, M., Group Theory and its Application to Physical Problems, Reading, Mass., Addison-Wesley, 1962.
6. Innovating Approaches to the Generation of Intense Magnetic Fields: Design and Optimization of a 4 Tesla Permanent Magnetic Flux Source, Bloch. F, et al, IEEE Transactions on Magnetics 34, p 2465, 1998.
7. U.S. patent application, Publication No. US2011/0137589 A1, and PCT Application, Publication No. WO 2011/066652, filed Dec. 1, 2010 both owned by the applicant and entitled "METHOD AND APPARATUS FOR PRODUCING HOMOGENEOUS MAGNETIC FIELDS".
8. U.S. Pat. No. 3,611,223 to Utsumi, issued Oct. 5, 1971.
9. U.S. Pat. No. 4,093,912 to Double et al., issued Jun. 6, 1978.
10. U.S. Pat. No. 4,580,098 to Gluckstern, et al., issued Apr. 1, 1986.
11. U.S. Pat. No. 4,673,882 to Buford, issued Jun. 16, 1987.
12. U.S. Pat. No. 4,758,813 to Holsinger et al., issued Jul. 19, 1988.
13. U.S. Pat. No. 5,003,276 to Sarwinski et al., issued Mar. 26, 1991.
14. U.S. Pat. No. 7,199,689 to Abele, issued Apr. 3, 2007.
15. U.S. Pat. No. 6,768,407 to Kohda and Kumuda, issued on Jul. 27, 2004.
16. US Patent application publication 2002/0179830 A1 "HALBACH DIPOLE MAGNET SHIM SYSTEM", published Dec. 5, 2002.
17. US Patent application publication 2009/0128272 A1 "HALBACH MAGNET ARRAY FOR NMR INVESTIGATIONS", published May 21, 2009.
18. US Patent application publication 2010/0244828 A1 "ADJUSTABLE PERMANENT MAGNET ASSEMBLY FOR NMR AND MRI", published Sep. 30, 2010.

Where permissible by law, all references cited herein are hereby incorporated herein by reference in their entirety.

BACKGROUND

In many areas of technology, it is desirable to control the spatial distribution of magnetic fields carefully. Well-controlled magnetic fields are particularly important in nuclear magnetic resonance (NMR) spectroscopy and other magnetic resonance (MR) applications. In many NMR spectroscopy experiments, a strong, static magnetic field is applied in a region of space that contains a sample under study, and it is desirable that this field be as spatially uniform as possible in order to observe important but subtle variations in the magnetic response of the sample. It is also desirable in many NMR applications to have a static magnetic field that is as strong as is practical.

At least three classes of magnets have been used to provide a strong, static magnetic field in NMR devices: superconducting electromagnets, resistive electromagnets, and permanents magnets. Permanent magnets or arrays thereof can be advantageous in applications where low cost, low maintenance or portability are desirable.

In practice, permanent magnets are often accompanied by pole pieces. The term "pole piece" is more fully defined herein but generally refers to a piece of magnetically permeable material placed in the vicinity of magnets in order to contribute to or shape a magnetic field.

SUMMARY

In one embodiment there is disclosed a pole piece comprising a rear face, a front face and ends, and a length, the rear face comprising at least one channel.

In alternative embodiments the at least one channel extends for substantially all of the length.

In alternative embodiments a pole piece comprises more than one channel.

In alternative embodiments the channel extends for a fraction of the length.

In alternative embodiments the channel comprises a surface that:
a) is substantially smooth; or
b) is substantially ridged; or
c) comprises at least one of protrusions and depressions.

In alternative embodiments the pole piece comprises a positioner actuable to adjust the position of the pole piece.

In alternative embodiments the pole piece further comprises a front face and the front face comprises:
a) at least one ridge; or
b) at least one groove; or
c) at least one ridge and at least one groove.

In alternative embodiments the pole piece is adapted to accept the insertion thereinto of at least one cooperating shimming rod.

In alternative embodiments the pole piece further comprises at least one shimming rod.

In alternative embodiments the pole piece comprises a female screw thread and a rod comprises a cooperating male screw thread so that the rod can be screwed into the pole piece.

In alternative embodiments there is disclosed a magnet array comprising at least one pole piece according to an embodiment.

In a further series of embodiments there is disclosed a method for shimming a magnetic field, the method comprising the step of using a pole piece comprising a rear face defining a channel to shim the field.

In alternative embodiments, there is disclosed a method comprising the step of adjusting at least one shimming rod, the adjustment based on:

a) a simulation of said magnetic field or;
b) parameters of said magnetic field extracted from a measured field map to thereby shim said magnetic field.

In alternative embodiments there is disclosed an apparatus for causing magnetic resonance in a sample, the apparatus comprising the pole piece according to an embodiment.

In alternative embodiments there is disclosed the use of a pole piece according to an embodiment to shim a magnetic field.

In alternative embodiment there is disclosed the use of a pole piece according to an embodiment to shim a magnetic field, the shimming comprising using the positioner to position the pole piece.

In alternative embodiments there is disclosed a magnetic field shimmed using a pole piece according to an embodiment.

In alternative embodiments there is disclosed the use of a pole piece according to an embodiment to cause or observe magnetic resonance in a sample.

In alternative embodiments there is disclosed a magnetic resonance apparatus comprising a pole piece according to an embodiment.

Features and advantages of the subject matter hereof will become more apparent in light of the following detailed description of selected embodiments, as illustrated in the accompanying figures. The subject matter disclosed is capable of modifications in various respects, all without departing from the scope of the subject matter hereof. Accordingly, the drawings and the description are to be regarded as illustrative in nature, and not as restrictive.

BRIEF DESCRIPTION OF THE DRAWINGS

FIGS. 3A through J are a series of views of a pole piece according to a first embodiment.

FIG. 3A is a perspective view of the embodiment.

FIG. 3B is a view of the rear face of the embodiment according to FIG. 3A.

FIG. 3C is a view of the front face of the embodiment according to FIG. 3A.

FIG. 3D is a section along line Y-Y of FIG. 3B.

FIG. 3E is a section along line X-X of FIG. 3B.

FIG. 3F is a section along line Z-Z of FIG. 3B.

FIG. 3G is a first end view of the embodiment according to FIG. 3A.

FIG. 3H is a view from the opposite end to FIG. 3G.

FIG. 3I is a first side view of the embodiment according to FIG. 3A.

FIG. 3J is a view from the opposite side to FIG. 3I.

FIGS. 4A through H are a series of views of a pole piece according to a second embodiment.

FIG. 4A is a perspective view of the embodiment.

FIG. 4B is a view of the rear face of the embodiment according to FIG. 4A.

FIG. 4C is a view of the front face of the embodiment according to FIG. 4A.

FIG. 4D is a section along line YY of FIG. 4B.

FIG. 4E is a section along line X-X of FIG. 4B.

FIG. 4F is a section along line Z-Z of FIG. 3B.

FIG. 4G is a first end view of the embodiment according to FIG. 4A.

FIG. 4H is a view from the opposite end to FIG. 4G.

FIGS. 5A through 5C are views of a third embodiment.

FIG. 5A is a perspective view of the embodiment.

FIG. 5B is a rear face view of the embodiment according to FIG. 5A.

FIG. 5C is a cross section view along line X-X of FIG. 5A.

FIGS. 6A through 6C are views of a fourth embodiment.

FIG. 6A is a perspective view of the embodiment.

FIG. 6B. is a rear face view of the embodiment according to FIG. 6A.

FIG. 6C is a cross section view along line Y-Y of FIG. 6A.

FIGS. 7A through 7I show an eighth embodiment.

FIG. 7A is a perspective view of the embodiment.

FIG. 7B is a first side view of the embodiment according to FIG. 7A.

FIG. 7C is a view from the opposite side to FIG. 7B.

FIG. 7D is a top view of the embodiment taken perpendicular to FIGS. 7B and 7C.

FIG. 7E is a section taken along line Y-Y of FIG. 7H.

FIG. 7F is a first end view of the embodiment according to FIG. 7A.

FIG. 7G is taken from the opposite end to FIG. 7F.

FIG. 7H is a bottom view taken from the opposite face to FIG. 7D.

FIG. 7I is a cross section along line X-X of FIG. 7D.

FIGS. 8A, 8B and 8C are cross sections of alternative embodiments.

FIG. 9A is a perspective view of a fifth embodiment.

FIG. 9B is a rear face view of the embodiment according to FIG. 9A.

FIG. 9C is an end view of the embodiment according to FIG. 9A.

FIG. 9D is a cross sectional view along line X-X of FIG. 9B.

FIG. 10A is a perspective view of a sixth embodiment.

FIG. 10B is a rear face view of the embodiment according to FIG. 10A.

FIG. 10C is and end view of the embodiment according to FIG. 10A.

FIG. 10D is a longitudinal section along line X-X of FIG. 10B.

FIG. 11A is a perspective view of a seventh embodiment.

FIG. 11B is a rear face view of the embodiment according to FIG. 11A.

FIG. 11C is an end view of the embodiment according to FIG. 11A.

FIG. 11D is a cross section along line Y-Y of FIG. 11B.

FIG. 11E is a cross section along line X-X of FIG. 11B.

FIG. 12 Is a cross sectional view of a ninth embodiment.

FIG. 13A and FIG. 13B are a pole piece according to FIG. 6 with the shimming rods in the home position.

FIGS. 14A through 14L show edge rims associated with the front face of embodiments.

FIGS. 14A and 14B show a first embodiment of rims on the front face of an embodiment.

FIGS. 14C and 14D show a second embodiment of rims on the front face of an embodiment.

FIGS. 14E and 14F show a third embodiment of rims on the front face of an embodiment.

FIGS. 14G and 14H show texturing of the surface of edge rims according to an embodiment.

FIG. 14I shows a perspective view of an embodiment with grooved edge rims.

FIG. 14J is a front face view of the embodiment according to FIG. 14I.

FIG. 14K is a cross section along line X-X of FIG. 14J FIG. 14L is an enlargement of region Z of FIG. 14K.

DETAILED DESCRIPTION OF EMBODIMENTS

Terms

Figure 1:
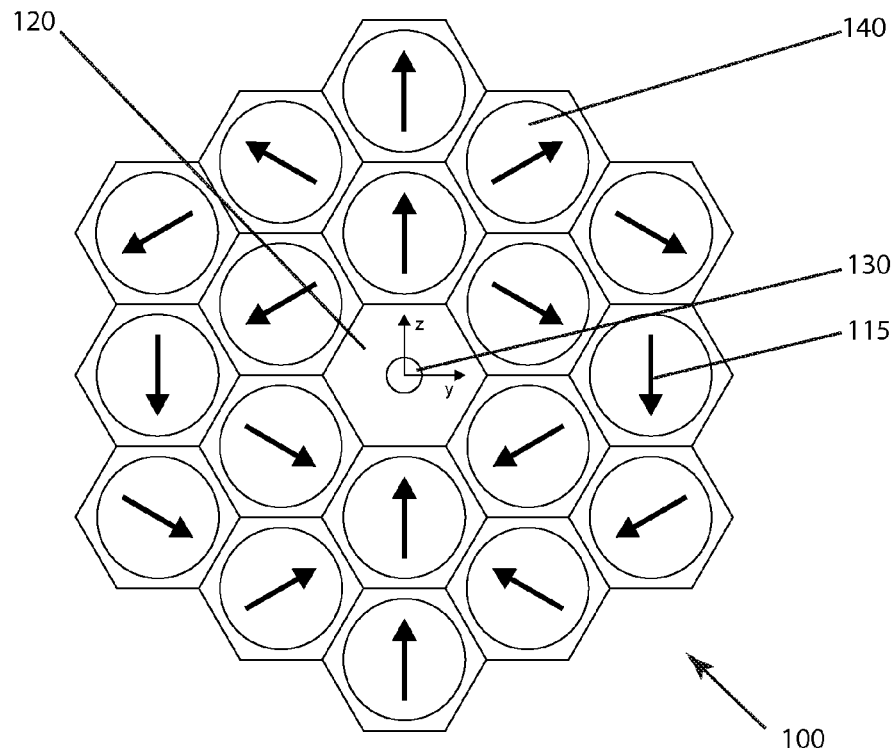
FIG. 1 is a schematic cross sectional view of a magnet assembly based on the Halbach cylinder.

In this disclosure, the recitation of a specified number of elements is understood to include the possibility of any greater number of such elements. Thus, for example, the recitation that a pole piece comprises two shimming rods indicates that the pole piece comprises at least two shimming rods, but may comprise 2, 3, 4, 5, 6, 7, 8, 9, 10 or any number of shimming rods greater than two and the recitation that a pole piece comprises a channel or one channel similarly indicates that the pole piece comprises at least one channel but may comprise 1, 2, 3, 4, 5, 6, 7, 8, 9, 10 or any number of channels greater than one. Similarly, reference to individual ones of a group of elements indicates that any single one or more than one of such elements has the specified property or characteristic.

In this disclosure the term "adjustment" when applied to any aspect of a pole piece, shimming rod, magnetic resonance apparatus or associated structures, operations or parameters, means and includes all types of possible adjustments which might be contemplated. Thus, for example, an adjustment to a shimming rod includes both physical adjustments such as changes in dimension, position, orientation, length, diameter, shape, material, and the like, and also includes the application or induction of a current in the rod, or any other steps that may be expected to modify the magnetic properties of the rod or otherwise modulate the effects of the rod on a primary or proximate magnetic field.

In this disclosure the term "sample" has its broadest possible meaning consistent with the disclosure hereof and means any item or material that may be, or may be desired to be, examined or tested using magnetic fields or within which it may be desired to induce or measure or detect magnetic resonance, or which it may be desired to examine using embodiments of the subject matter disclosed herein. In particular embodiments samples include or comprise or consist of solid and non-solid objects and materials, living, non-living or dead materials, chemicals, structures, devices, gases, liquids, and solids, or any combinations of any of the foregoing. In particular embodiments and without limitation a sample includes one or more organisms or tissues and such organisms or tissues are or include plants, animals, and microorganisms, and include human and animal subjects or parts thereof. Without limitation the term sample includes experimental or medical subjects of any kind whatsoever, whether living, dead or non-living.

In this disclosure the term "pole piece" refers to at least one piece of magnetically permeable material placed in the vicinity of primary magnets for use in contributing to or shaping the primary magnetic field or intended to be placed in the vicinity of primary magnets for use in contributing to or shaping the primary magnetic field. In embodiments pole pieces and assemblies comprising pole pieces are suitable for use in confined spaces, and for example but not by way of limitation, in embodiments pole pieces and assemblies comprising pole pieces are suitable for use in the central space or cavity of a magnet array which in embodiments is a Halbach Array and in embodiments is in a magnetic resonance device. In particular embodiments pole pieces consist of or comprise any suitable material, including but not limited to iron, cobalt, nickel, and alloys thereof; and may be of any suitable shape and size. In particular embodiments pole pieces are broadly prismic, or are broadly trapezoidal in cross section and have a front face or a rear face or a front face and a rear face, or a front face, a rear face, ends and a length. It will be understood that in use, the front face of a pole piece is or comprises a surface of the pole piece that is oriented towards or is proximate to a defined volume or sample volume or sample, and distal to an underlying or associated magnet whose field the pole piece is intended to influence. Conversely the rear face of a pole piece refers to a surface or portion of the surface of the pole piece that is proximate to one or more magnets whose field the pole piece is intended to influence, and distal to a defined or sample volume wherein a sample is to be positioned. Thus it will be understood that in generally cross-sectionally trapezoidal embodiments, notwithstanding that the sides and rear face of a pole piece are generally assigned different reference numbers for clarity of explanation, in embodiments the sides are understood to form a part of the rear face of the pole piece and in embodiments the statement that a channel is comprised in the rear face of a pole piece contemplates the possibility of a channel being positioned in a side of the pole piece. Where magnets are assembled into an array enclosing or partly enclosing a defined or sample volume, then the pole pieces associated with the component magnets of the array will have their front faces oriented inwards towards the defined or sample volume approximating the center of volume surrounded by the array, and their rear faces oriented outwards and proximate to the surrounding primary magnets. It will be understood that the pole pieces according to embodiments have elongated faces and that in embodiments they are in the form of suitably shaped plates. In embodiments a pole piece has more than one front face and in embodiments has more than one rear face. In embodiments the front face of a pole piece is substantially flat or substantially curved over part or all of its surface.

In embodiments the front face is bounded on one or more edges by a rim, also referred to as an edge, raised edge or other like term. It will be understood that in common usage these structures may also be referred to as "ridges" but herein this term is avoided in order to avoid confusion with the other ridge structures contemplated. In embodiments the front face is adapted to mount a shim panel thereon. In embodiments a pole piece or pole pieces is shaped to cooperate with an associated magnet or magnet arrays. In embodiments and without limitation, pole pieces are adapted to receive or cooperate with shim rods or shim panels, to be held or positioned or to accept rods or other mounting or securing structures, or are shaped to adjust their magnetic or other properties as desired by a user. In one embodiment, a pole piece is about 3.5 inches long, and its front face is about 1.1 inches wide. The cross section is substantially trapezoidal, with dihedral angles of 60 degrees between the front face and the angled sides and 120 degrees between the rear face and the sides, so that the pole piece can fit snugly into a cavity of hexagonal cross section. The height of the trapezoid, from the front face to the rear face, is about 0.32 inches. The edge rims on the front face of the pole piece run the length of the pole piece, and are about 0.04 inches high (in the dimension perpendicular to the front face) and about 0.06 inches wide. The rear face comprises a channel, which is in the form of a rectangular parallelepiped about 1.80 inches long, 0.39 inches wide, and 0.24 inches deep. In one variant embodiment that includes shimming rods, the holes to accommodate the shimming rods can be about 0.12 inches in diameter and threaded to accept a shimming rod. In one embodiment of the embodiment the shimming rods are about two inches long. It will be understood that all of the foregoing dimensions may be adjusted in all manner of ways in different embodiments and to suit particular requirements and all such modifications will be well understood and readily implemented by those skilled in the art.

A wide range of shapes, sizes, materials and conformations for pole pieces will be readily identified and implemented by those skilled in the art. Examples of pole piece designs according to embodiments are shown in the drawings.

In this disclosure the term "position" means and includes all aspects of the position of an item or object. Without limitation, position refers to the position of an object in one, two or three dimensions, and includes the orientation of the object in any dimensions. In parts of this disclosure position refers to the position of a pole piece and includes displacement of the pole piece both translationally or rotationally in any dimensions.

In this disclosure the term "positioner" means any apparatus or assembly useable to adjust the position of a pole piece or shimming rod or of a pole piece and its associated or inserted shimming rods. In embodiments a positioner includes or has associated therewith rods, brackets, clips, sticks, poles, pins, screws, bolts, slides, ratchets, recesses, mountings, or any other suitable structure for in any way adjusting the position of a pole piece. In particular embodiments a positioner comprises one or more threaded rods or screws whose size and pitch can be chosen as desired to facilitate the magnitude and degree of adjustment made. In embodiments of this type it will be understood that controlled rotation of the rod or screw will result in displacement of the rod or screw and thereby the exertion of a directional force on the pole piece, or that the pole piece may be moved by engagement with the rod or screw. In either case, the movement of the thread or screw will determine the movement of the pole piece and the orientation or position of the rod or screw and degree of rotation thereof will determine the extent and directions of movement of the pole piece. In particular embodiments a pole piece is securable or restrainable with mounting rods, and in embodiments such rods form part of or cooperate with a positioner to position the pole piece according to user determined parameters. In embodiments such positioning rods are non-ferromagnetic and it will be understood by those skilled in the art that in alternative embodiments some or all elements of the positioner will be magnetically permeable or impermeable, ferromagnetic or non-ferromagnetic as desired by a user. It will be understood that the materials will be chosen by those skilled in the art with reference to their effects or lack of effects on the properties of a surrounding magnetic field. Where used in a Halbach cylinder then pole pieces according to embodiments are positioned in the central cavity of the array and enclose or partly enclose a desired sample volume, as broadly illustrated in FIG. 1 and FIG. 12.

In embodiments the positioner comprises threaded rods which are engageable with cooperating threaded holes in the pole piece. In embodiments the shimming rod holes may function as holes for receiving such threaded positioning rods. It will be understood that in this contemplated arrangement, rotation of the positioning rod will serve to displace the pole piece or a part thereof relative to the threaded rod. Thus rotation of the rod or rods will serve to adjust the position of the pole piece in controllable increments. In other embodiments, the positioner comprises threaded rods or other mechanical linkages that are engageable with cooperating designated regions on the pole pieces, which permit adjustment of the position or orientation of the pole piece through forces or torques exerted on the pole piece that are controllable by a user by manipulating the positioner. A wide variety of other means to position the rods, including both shimming and positioning rods, to position the pole pieces, and to position both rods and pole pieces, will be readily identified and implemented by those skilled in the art and all such alternatives are contemplated by the term "positioner" and like terms, as used herein.

In this disclosure the term "pole piece assembly" means a combination of a pole piece with one or more accessory structures. In embodiments such accessory structures include but are not limited to one or more of a shim panel, a shimming rod (also referred to as a shim rod), a mounting or positioning rod, part or all of a positioner, a frame, and in embodiments a pole piece assembly comprises more than one of any or all of the foregoing. In embodiments a pole piece assembly is adapted to cooperate with, or fit into or fit with or engage or be readily assemblable with a primary magnet, or primary magnet array or one or more additional pole piece assemblies. The term "central cage" or "cage" refers to one form of pole piece assembly and comprises a preassembled pair, or other numerical group, of pole pieces suitably mounted for insertion into the central cavity of a magnet array. An example of an embodiment of a cage is illustrated in FIG. 7.

In this disclosure the term "channel" where used with reference to a pole piece, means any form of channel, groove, recess, depression, or concavity in a surface of the pole piece and any internal adjustment to a volume of the pole piece that reduces or changes the magnetic permeability in a defined volume within the pole piece. Thus, without limitation, in alternative embodiments a channel includes a hole formed through a pole piece which is open at a surface or is not open at a surface or is partly open at a surface, or a hollow groove with a closed top, or a hole drilled or otherwise cut or formed internal to a pole piece. In embodiments one or more channels are provided on the rear face of a pole piece and where multiple channels are provided these may be of the same or different lengths, widths or depths. In alternative embodiments, a channel has rounded corners (fillets) or is of oval, circular, semicircular, triangular, or trapezoidal cross section, or is curved or non-linear, or is open or covered, or comprises a shimming hole or is not open on one side.

In embodiments a channel is filled with any desired material which has desired magnetic properties, or is chosen to strengthen, lighten, intensify, diminish, or otherwise modify or adjust the physical and magnetic properties of the pole piece in a manner desired by a user. In embodiments a channel extends for all or substantially all of the length of a pole piece and in embodiments a channel extends for a fraction of the length of the pole piece, which fraction may be substantially less than the length of said pole piece and may be more or less than about 10%, 20%, 30%, 40%, 50%, 60%, 70%, 80%, or 90% of the length of the pole piece. Where multiple channels are provided then in embodiments a plurality of channels are of substantially the same dimensions and in alternative embodiments channels have different dimensions. In embodiments one or more of the inner surfaces of a channel are optionally textured in all manner of ways and in embodiments are partly or wholly substantially smooth, ridged, corrugated, grooved, dimpled, and in embodiments bear protrusions or recesses or both protrusions and recesses and in embodiments any grooves, ridges, corrugations, scratches and other extended surface features are oriented in any desired directions. It will be understood that ridges, whether present in a channel or on the front face or other surface of a pole piece, may have a range of geometries and in particular embodiments ridges are of uniform cross-section, uniform height, uniform separation, uniform length and uniform orientation. In alternative embodiments ridges are of non-uniform cross-section, non-uniform height, non-uniform separation, non-uniform length and non-uniform orientation and in embodiments are notched. All of such surface modifications will be readily understood and implemented by those skilled in the art to suit particular purposes.

In alternative embodiments a channel is produced by cutting, preforming, compression or any other suitable means. In embodiments, one or more channels extend the entire length of the pole piece. In other embodiments, one or more channels extend only a fraction of the length of the pole piece, or extend for substantially less than the length of the pole piece. Where a plurality of channels are provided these may be sized, shaped and filled in identical manners, or in different manners as required by a user. In embodiments a pole piece comprises one channel and in alternative embodiments comprises two, three, four, five, six, seven, eight, nine, ten, eleven, twelve or more channels. Where multiple channels are provided then in embodiments they extend for a part or all of the length of the pole piece, or are symmetrically arranged, or are asymmetrically arranged, or are longitudinally oriented or are transversely oriented or are the same or different lengths, depths, widths or otherwise have the same or different geometries or properties. In embodiments comprising more than one channel, it will be understood that in alternative embodiments such channels are of equal or different lengths and may be equally or differently spaced. Similarly in embodiments channels may be straight or curved and may be continuous or discontinuous along their length or width.

In this disclosure the term "shimming rod" means a shimming rod used to adjust the magnetic field proximate to a pole piece and the term "shimming hole" means a hole in a pole piece shaped and sized to accept the insertion of a cooperating shimming rod thereinto. In embodiments, shimming rods are made of a magnetically permeable material whose magnetic permeability is similar to or the same as that of the pole piece itself or in alternative embodiments is different. Shimming rods and holes according to particular embodiments are cylindrical, or polygonal or have any other cross section and shimming rods and holes are optionally shaped in a variety of manners to allow the desired amount of freedom for the position of the shimming rod to be adjusted relative to the pole piece. In particular embodiments and without limitation, shimming rods and holes have cross sections that are substantially regular or irregular and that are substantially circular, oval, triangular, rectangular, square, rhomboidal, pentagonal, hexagonal, heptagonal, octagonal, nonagonal, decagonal or that have 3, 4, 5, 6, 7, 8, 9, or more sides. It will be understood that a shimming hole need not be enclosed on all sides, so that in some embodiments a shimming hole is a groove, depression or channel which is open along one side. It will be further understood that in embodiments a shimming rod or rods are positioned relative to a pole piece, but are not inserted thereinto, and that a pole piece according to other embodiments incorporates cooperating channels or holes to accommodate the shimming rod or rods. In embodiments a current is applied to a shimming rod or a shimming rod is otherwise treated to modify the magnetic properties thereof and in embodiments such treatment or current application is dynamic and in embodiments responds to an input and in embodiments such input derives from a user, or from modelling or monitoring or measuring or prediction regarding the magnetic field to be shimmed. It will also be understood that where a positioning rod or shimming rod is to be rotated or is to be engaged with a cooperating hole by means of reciprocal threads, then the geometry of the rod and hole will be adjusted to facilitate this use. It will be understood that the descriptor "threadingly" may alternatively be used to describe such reciprocal threading engagement. It will be understood that herein where reference is made to a shimming rod that is associated with a pole piece, it is meant that such shimming rod is proximate to such pole piece, and in embodiments is inserted into such pole piece, and in embodiments is merely positioned outside of but at a distance from such pole piece. By way of example and not limitation, the shimming rods identified as elements 732 in FIG. 7, while not inserted into a pole piece, are inserted into the cage structure generally designated 700 and are understood to be "associated with" at least one pole piece comprised in the cage structure 700.

In embodiments, shimming rods are threaded and engage a cooperating reciprocal thread on the inside surface of the receiving shimming rod hole. In embodiments such threading engagement serves to position the rod and to secure the rod into the hole and the geometry of the rod and the rod-receiving hole will be chosen to permit the necessary rotation. A wide variety of alternative means to mutually engage or position shimming rods and pole pieces will be readily apparent to those skilled in the art.

In this disclosure the term "shimming" refers to any method for suppressing magnetic field inhomogeneity, including but not limited to inhomogeneity in a primary field generated by a magnet array. For greater certainty it will be understood that the term shimming includes both active shimming, wherein the shimming effect may be achieved by the application of a current to thereby generate an induced and user determined magnetic shimming field, and passive shimming wherein the shimming effect is achieved solely by the positioning of a ferromagnetic or other object having predetermined magnetic properties. In embodiments said positioning may be under the direct control of a user or may be part of an automated system that makes use of data, including spatial or temporal characteristics, derived from measurements of the primary magnetic field. Thus the use of actively controlled shim panels and shim traces, the use of pole pieces, and the use of structural adjustments to any of the foregoing, are all included within the scope of the term "shimming" as used herein.

In embodiments of the subject matter hereof, the magnetic field is a primary magnetic field and is generated or maintained within a magnetic resonance device, which in embodiments is a nuclear magnetic resonance (NMR) machine, and in embodiments is a spectrometer and in embodiments is a compact NMR machine. One method of shimming is to apply electrical currents to conducting elements positioned close to a preferred volume in which a primary magnetic field is to be controlled, and such conducting elements may also be positioned close to a relevant magnet or pole piece. Another method of shimming is to modify the position of magnetically polarized elements positioned close to such a preferred volume. The term shimming as used herein contemplates all such methods and adaptations thereof. In this disclosure the term "shim panel" refers to assemblies bearing conducting shim paths that can be mounted as desired relative to a magnet or pole piece and used for shimming the magnetic field associated therewith. In embodiments a shim panel is mounted on or proximate a pole piece and in embodiments a shim panel is mounted on the front face of a pole piece. In some embodiments a shim panel is a circuit board or plurality of circuit boards.

In this disclosure the term "magnetic resonance" or "MR" means resonant reorientation of magnetic moments of a sample in a magnetic field or fields, and includes nuclear magnetic resonance (NMR), electron spin resonance (ESR), magnetic resonance imaging (MRI) and ferromagnetic resonance (FMR). As the present invention pertains to methods and apparatus for rendering general static magnetic fields more uniform, in embodiments the invention is also applied in ion cyclotron resonance (ICR) or in trapped-ion or particle-beam technology generally. For simplicity of explanation, the term magnetic resonance or MR as used herein will be understood to include all of these alternative applications. In particular applications and embodiments the apparatuses and methods disclosed are applied to NMR and in embodiments they are applied to NMR spectrometers or to NMR imagers. Materials that display magnetic resonance when exposed to a magnetic field are referred to as magnetically resonant or MR active nuclides or materials.

In this disclosure the term "primary magnet" refers to one of the magnets contributing to a primary magnetic field for use in magnetic resonance applications. In embodiments there are two or more such primary magnets and the homogeneity of the field (referred to as the "primary field") therebetween is modulated or improved by the use of one or more of pole pieces, shimming paths, shim panels, and shimming rods.

In this disclosure a "magnet array" into which a pole piece is inserted means an arrangement of magnets configured to generate a desired magnetic field and includes a Halbach cylinder or Halbach array. In this context "cylinder" is defined broadly to mean a shape that has at least partial translational symmetry along a line segment. In particular embodiments, the cylinder has circular, square, rectangular, hexagonal or octagonal cross section, or cross section having other shapes. In embodiments pole pieces according to embodiments are comprised in or are used in association with any form of magnet array, including but not limited to arrays wherein one or more primary magnets may be placed outside each pole piece, and wherein a permeable magnetic material may be placed further outside the primary magnets so as to confine magnetic flux. Two types of the foregoing array are sometimes known as "poke and yoke" assemblies or "shielded" magnet assemblies. It will be understood that a wide range of other geometries of magnet array will be adopted and will be readily recognised and implemented by those skilled in the art.

In this disclosure the term "primary" or "main" field or primary or main magnetic field means the primary field generated in an apparatus for magnetic resonance applications. General references to a field or a magnetic field are understood to include such primary or main magnetic fields.

In this disclosure the term "sample volume" refers to a volume of space wherein a sample may be placed and exposed to a main or primary magnetic field for the purposes of detecting the magnetic resonance properties of the sample, including determining the presence, absence, or characteristics of magnetic resonance in the sample. The sample volume is of any suitable dimensions and in embodiments is enclosed or partly enclosed, and is or is capable of being a vacuum or partial vacuum or being atmosphere-controlled. In embodiments the sample volume is a region within the central space or cavity of a magnet array. In embodiments the sample volume has disposed thereabout pole pieces, shim paths, shim panels and such other apparatus as may be necessary or desirable. In particular embodiments the sample volume is or is within or comprises a hexagonal or cylindrical or other shaped cavity and in embodiments is bounded by one or more or a plurality of magnets. In embodiments the sample volume comprises apparatus suitable to spin, rotate or otherwise move the sample.

In this disclosure a reference to "modulating" a magnetic field or an inhomogeneity that may be comprised therein, refers to imposing one or more desired constraints on the configuration of the field at any point in space or time. Thus modulating refers generally to the achievement of a desired property or the suppression of an undesired property of the field or inhomogeneity.

In this disclosure references to "detecting", "measuring", "analysing", "observing" and like terms, where used with reference to magnetic resonance, refer to any efforts to establish, quantify or analyse the presence, absence, quantity, quality or characteristics of magnetic resonance in a sample. Thus, the terms are to be understood to contemplate and include all such efforts, including those where the sample displays no detectable magnetic resonance or where the efforts are unsuccessful in detecting or elucidating the characteristics of such magnetic resonance.

In this disclosure references to "inducing", "causing", "promoting", "generating" and like terms, where used with reference to magnetic resonance, refer to any efforts to cause, induce, promote or modify magnetic resonance in a sample. Thus, the terms are to be understood to contemplate and include circumstances wherein conditions are established that would promote the occurrence of magnetic resonance, even if the sample displays no detectable magnetic resonance as a result thereof.

In this disclosure a "geometrical component" of a magnetic field or an inhomogeneity refers to a component of the magnetic field or inhomogeneity when its measured or estimated functional form is expressed as a sum of individual functions of spatial variables characterizing positions within a preferred volume. The set of individual functions can be any suitable set, such as a set of spherical, cylindrical, or cubic harmonic functions, scalar or vector or tensor harmonics, Bessel functions, or other functions.

In this disclosure "suppressing" an inhomogeneity refers to any adjustment to the geometrical components of a magnetic field to correct or smooth out or otherwise adjust, overcome or modify undesired irregularities or distortions in the field. Suppressing according to embodiments comprises complete or partial suppressing and in embodiments affects one or more geometrical components of the field. In particular embodiments suppressing is actuated to cause a magnetic field to adopt a predetermined desired degree of homogeneity.

In this disclosure, any structures or portions of structures used in embodiments are constructed from, consist of or comprise any suitable materials. For example, in embodiments pole pieces or any other magnetically permeable components are constructed from high permeability materials such as mu-metal or permalloy. Those skilled in the art will understand that these and other materials may be sold under trade names or trade-marks such as Hiperco™, Carpenter Hymu80™, Carpenter High Permeability 49™, Ni49™ or Alloy 4750™. In embodiments, magnet arrays comprise permanent magnets constructed from any suitable materials, including without limitation neodymium-iron-boron, samarium-cobalt, alnico, or any other suitable alloy or material, In some embodiments such permanent magnet materials will be uniformly magnetized throughout their volume and in alternative embodiments such materials will be non-uniformly magnetized, all as determined by a user in ways known and understood by those skilled in the art. Those skilled in the art will readily select, adapt, and work with suitable materials for any given application.

Introduction:

One way to produce magnetic fields in a specified volume, in magnetic resonance as in other areas of technology, is to place permanent magnets near or around the volume. One relatively efficient design for producing a substantially strong field in a small volume is the Halbach cylinder, wherein permanent magnet materials are oriented in a well defined way and arranged around a central cavity.

FIG. 1 shows an example configuration of magnets in a Halbach-based design in cross-section. The assembly is generally designated 100. Hexagonal magnets 140 each have an individual magnetization direction indicated by arrows 115. The individual magnets form a cylindrical arrangement surrounding a central cavity 120. In use a sample will generally be positioned in a defined sample volume or sample space 130 at or close to the center of the central cavity 120. The Halbach cylinder is commonly viewed as providing both enhanced field strength and uniformity. FIG. 1 is a view along a symmetry axis x of the general hexagonal symmetry of the assembly as a whole, and the sample volume is defined by a cavity which extends down along this axis x, which is perpendicular to the page, and which extends into the page away from the reader. The y and z axes are shown in FIG. 1 and those skilled in the art will recognize that the x, y and z axes are mutually perpendicular.

One way to increase the strength of a magnetic field in a magnet array is to use pole pieces, which can acquire a magnetic polarization when placed in a magnetic field. This polarization can increase the strength of the magnetic field in the region of space near the pole piece to a value that is larger than it would be in the absence of the pole piece. Sometimes in applications it is desirable to use pole pieces in pairs rather than individually.

Figure 2:
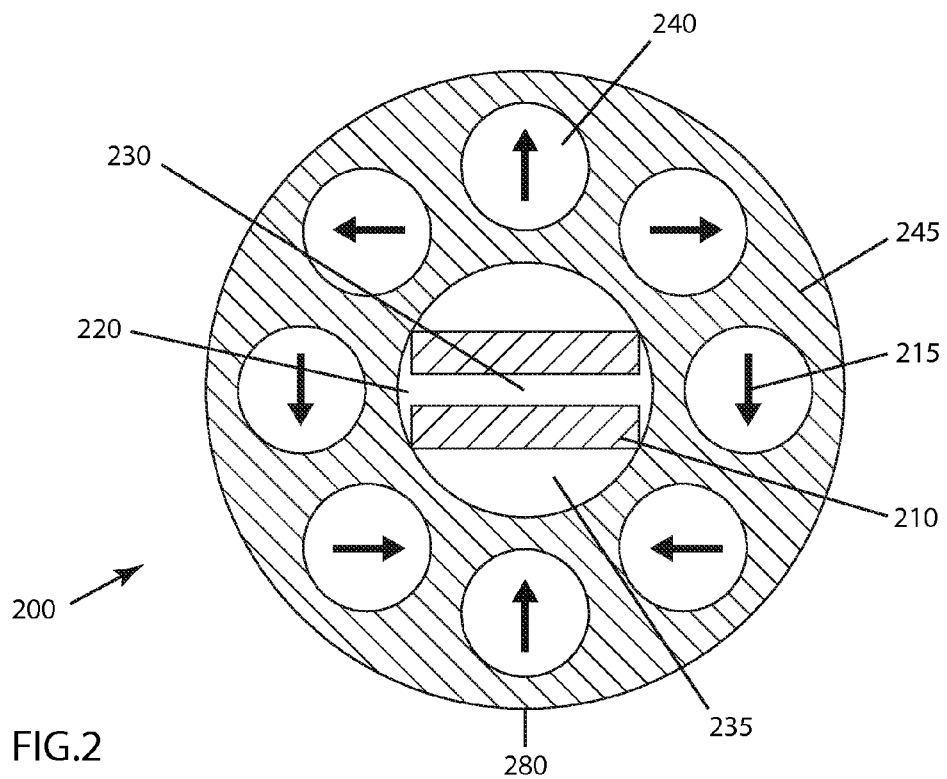
FIG. 2 is a schematic cross sectional view of a configuration of a Halbach-type magnet array and pole pieces.

FIG. 2 shows schematically the basic features of a Halbach-based magnet design described by Moresi and Magin and generally designated 200. The assembly comprises a magnet array 280 comprising individual cylindrical magnets 240 embedded in a matrix 245, such as an aluminium matrix. Each individual magnet has an individual magnetic field direction 215. The magnet cylinder encloses a central cavity 220 within which are mounted mutually opposed pole pieces 210. The pole pieces are mounted relative to the surrounding primary magnets and matrix by a mounting material or structure 235. A sample to be examined will normally be placed in the sample space 230 between the opposed pole pieces.

The present disclosure provides pole piece designs which in embodiments are suitable for use within confined spaces, such as in Halbach-type magnets. In embodiments the designs increase the strength of the magnetic field in a designated sample volume; increase magnetic field uniformity in the designated sample volume, making the field substantially spatially uniform within the volume; and help to correct for fabrication imperfections dynamically.

Embodiments of the subject matter claimed are described with general reference to FIGS. 1 through 14.

First Embodiment

A pole piece according to a first embodiment is described with general reference to FIG. 3.

The pole piece according to the embodiment is generally designated 300, has a body designated 302 with a substantially flat front face 370 having raised edges 375 and has a rear face 360. In the illustrated embodiment the pole piece is generally trapezoidal in cross section having opposed ends 311, 312 and opposed diagonal sides 315, 316. As will be seen, a channel 390 is formed into the rear face 360 of the pole piece. The channel 390 has ends 335, 336 which define the length of the channel, and has sides 337, 338 and bottom 340.

It will be seen that in the illustration the channel extends only a fraction of the length of the pole piece, is straight, is rectangular in cross section and has sharp, right-angled corners. In alternative embodiments, it will be understood that the channel feature has rounded corners (fillets), or chamfered edges, or is of oval, circular, semicircular, triangular, or trapezoidal cross section, or is curved or non-linear, or is open or covered, or comprises a shimming hole or is not open on one side.

In the illustrated embodiment raised rims 375 run along the whole or a portion of one or more of the edges of the front face 370 of the pole piece. However it will be understood that these are omitted in other embodiments. Moreover, it will be understood in embodiments such rims have non-uniform cross section and in embodiments comprise features such as holes, notches, protrusions, depressions or other structural features and in embodiments are of varied length non-uniform length, non uniform orientation, or non-uniform separation.

A wide variety of different cross sections and configurations are possible and are used in different embodiments. By way of example and not limitation, in the embodiment according to FIG. 3, front face 370 is substantially flat and rectangular. In alternative embodiments the front face is curved or is shaped to accept or comprise a shim panel or one or more shim paths.

Similarly, while the illustrated embodiment of FIG. 3 comprises only one channel, in alternative embodiments there are provided two, three, four, five, six, seven, eight or more channels.

In embodiments, one or more surfaces of the channel 390 are, in whole or in part, substantially smooth; or substantially ridged; or comprise at least one of protrusions and depressions. In embodiments the corners or edges of adjoining surfaces are filleted, beveled, or chamfered. Part or all of the bottom surface 340 of alternative embodiments is substantially flat or substantially curved, or is stepped. In alternative embodiments a pole piece has an associated positioner actuable (which term is used to indicate that the positioner may be actuated) to adjust the position or orientation of the pole piece.

In further alternative embodiments front face 370 comprises at least one ridge, or at least one groove or both at least one ridge and at least one groove.

Second Embodiment

A pole piece according to a second embodiment is described with general reference to FIG. 4.

The pole piece according to the embodiment is generally designated 400, has a body designated 402 with a substantially flat front face 470 having raised edges 475 and has a rear face 460. In the illustrated embodiment the pole piece is generally trapezoidal in cross section having opposed ends 411, 412 which define the length of the pole piece, and has opposed diagonal sides 415, 416. As will be seen, a channel, 490, is formed into the rear face 460 of the pole piece. The channel 490 has ends 435, 436 and sides 437, 438 and bottom 440.

In the illustrated embodiment raised edge rims 475 run along the whole or a portion of one or more of the edges of the front face 470 of the pole piece.

It will be seen that body 402 of the pole piece comprises shimming holes 483, 484 extending from ends 411,412 of the pole piece through to ends 435,436 of channel 490.

The following third and fourth embodiments comprise a body according to the third embodiment, in combination with suitable shimming rods.

Third Embodiment

FIG. 5 shows a pole piece according to a third embodiment.

The pole piece is generally designated 500 and the body 502 of the pole piece extends between ends 511, 512 and has front face 570 and rear face 560. It will be seen that the pole piece body 502 is adapted to accept the insertion of shimming rods designated 591 and 592. In one embodiment shim holes 583 and 584 are provided at the ends of the pole piece 500. It will be seen that the shimming holes 583, 584 extend from the relevant end 511 or 512 of the pole piece, to the adjacent end of channel 590. It will be apparent that the holes 583, 584 will be defined to accommodate suitably sized or otherwise cooperating shimming rods. The shimming rods and shimming holes comprise cooperating threads to allow adjustment and securing of the rods within the holes.

It will be understood that while FIG. 5 illustrates four shimming holes and four shimming rods, in alternative embodiments there are provided one, two, three, four, five, six, seven, eight, nine, ten or more or less shimming holes or one, two, three, four, five, six, seven, eight, nine, ten or more or less shimming rods, or any combination of the foregoing.

While the illustrated arrangement of shimming rods and shimming holes is symmetrical, in alternative embodiments of the embodiment, the arrangement of rods, or of holes, or of rods and holes, is asymmetrical, as required by the user.

Fourth Embodiment

FIG. 6 shows a fourth embodiment wherein the arrangement of shimming rods is different from the corresponding arrangement shown in FIG. 5. The pole piece of FIG. 6 is generally designated 600 and has ends 611 and 612 and a channel 690 recessed into rear face 660. The same configuration of shimming holes 683, 684 is provided as in FIG. 5, and that the same number of shimming rods 693, 694 is also provided. However it will be seen that rods 693 which are positioned towards a first side 615 of the pole piece, are inserted further into channel 690 than rods 694 which are positioned towards the other side 616 of the pole piece. Thus in this embodiment, arrangement of shimming rods is asymmetrical about the longitudinal axis extending between ends 611, 612 of the pole piece but is symmetrical about the transverse axis of the pole piece.

Fifth Embodiment

A pole piece according to a fifth alternative embodiment is shown in FIG. 9. The embodiment is generally designated 900, having a body 902 comprising front face 970 and rear face 960 comprising channel 990.

As will be seen the body 902 of the pole piece extends for a length between ends 911 and 912 and extends between sides 915, 916. Front face 970 is substantially flat with edge rims 975. Rear face 960 comprises a channel 990 which does not extend for the full length of the pole piece body. It will be seen that ends 935, 936 of channel 990 are curved and that in cross section the channel 990 has sides 937, 938 which are substantially perpendicular to substantially flat bottom 940. At each of ends 911, 912 of the pole piece there is provided a single shimming hole 983 which is substantially aligned with the longitudinal axis of the pole piece. In the configuration shown, individual shimming rods 993 are positioned in the shimming holes and are inserted a substantially equivalent distance into the channel 990 so that the assembly has symmetry about line X-X.

Sixth Embodiment

A pole piece according to a sixth alternative embodiment generally designated 1000 is shown in FIG. 10.

As will be seen the body 1002 of the pole piece extends for a length between ends 1011 and 1012 and sides 1015, 1016. Front face 1070 is substantially flat with edge rims 1075. Rear face 1060 comprises a channel 1090 which extend for the full length of the pole piece body and opens at ends 1011 and 1012 thereof. Front face 1070 is substantially flat and is bounded by edge rims 1075. In longitudinal section it will be apparent that the depth of the channel 1090 varies along its length. Thus, in FIG. 10D, which is a longitudinal section taken along line X-X of FIG. 10B, it will be seen that the channel bottom is divided into three sections, 1051, 1052, 1053, with the middle section 1052 being recessed into the body 1002 of the pole piece further than either of sections 1051, 1053. It will be seen in cross section, channel 1090 has sides 1037, 1038 which are substantially perpendicular to each substantially flat bottom region 1051, 1052 and 1053.

Seventh Embodiment

A pole piece according to a seventh alternative embodiment is shown in FIG. 11 and is generally designated 1100, having a body 1102 that extends for a length between ends 1111, 1112. Front face 1170 is substantially flat but has edge rims 1175. Rear face 1160 comprises a channel 1190 having a substantially flat bottom 1150 and sides 1137, 1138 that are substantially perpendicular to bottom 1150.

Sides 1115 and 1116 of the body 1102 comprise additional grooves 1121 running along the sides 1115, 1116 of the pole piece and opening at the ends thereof. Rear face 1160 also comprises four shorter grooves 1124.

Alternative Geometries of the Channels and Front Faces According to a Series of Embodiments FIG. 8 shows different cross-sectional geometries for pole pieces according to embodiments. In alternative embodiments of the first and other embodiments, a channel has different cross section and the front face of the pole piece has a different profile.

Thus in FIG. 8A, curved front face 870 is combined with a rear face 860 comprising channel 890 having perpendicular sides 837, 838 and bottom 840.

In FIG. 8B, the front face 871 is flat and rear face 861 comprises channel 891 having a curved cross sectional profile.

In FIG. 8C, front face 872 is substantially flat and rear face 862 comprises channel 892, which is substantially trapezoidal in cross section having sloped sides 897, 898 and bottom 899.

It will be understood that a wide range of variations are possible and will be readily understood by those skilled in the art. It will also be understood that the combinations of channel geometry and front face geometry presented in FIG. 8 are for purposes of illustration only and are not limiting, all combinations being possible in and in combination with alternative embodiments.

Eighth Embodiment

An eighth embodiment wherein pole pieces according to embodiments are assembled for insertion into the central space of a magnet array is now described with general reference to FIG. 7.

In FIG. 7, an embodiment is shown in which opposed pole pieces 710 are assembled into a unit generally designated 700 which is configured to be suitable to fit into the central space of a magnet array. Pole pieces 710 are of the general embodiment shown in FIG. 5. As will be seen shimming rods 784, 783 are inserted into the ends 711, 712 of the pole piece. Two cooperating pole pieces 710 are positioned face to face as shown in the cross section FIG. 7I taken along line X-X of FIG. 7D, and the front faces 770 and edge rims 775 at least in part define between them a volume 776 comprising a designated sample volume 730. The central cage assembly 700 comprising opposed cooperating pole pieces 710 is held together by frame 722. Frame 722 comprises lengthwise struts 724, and end pieces 726. End pieces 726 contain cut-outs 728 to permit access to and positioning of the shimming rods 783, 784. It will also be seen that frame 722 permits the insertion and positioning of additional shimming rods 732 through holes 734. The additional shimming rods 732 are not inserted into the pole pieces but lie adjacent to them as determined by a user. A sample may be introduced to space 776 and positioned in sample volume 730 through access hole 731 using methods and apparatus that will be readily understood and used by those skilled in the art.

It will be seen that in the illustrated embodiment the two opposed pole piece assemblies each comprising a pole piece and shimming rods, are oriented in opposite orientations. The arrangement of the shimming rods within an individual pole piece is essentially that seen in the individual pole piece 500 according to FIG. 5. In the assembly according to FIG. 7 it will be seen that in one pole piece the shimming rods are generally displaced towards a first end of the cage or assembly 700, and the opposed pole piece is in the reverse orientation. Those skilled in the art will readily understand that the pole pieces and shimming rods comprised in the assembly 700 may be arranged and adjusted in a wide range of alternative configurations as necessary or desirable for particular purposes.

Ninth Embodiment

An embodiment wherein pole pieces according to embodiments are positioned in a magnet array is now described with general reference to FIG. 12. It will be seen that two pole pieces 1210 are disposed within the central cavity, 1220, of a hexagonal Halbach cylinder or magnet array, 1280. In one embodiment magnet array 1280 comprises six individual magnets 1240, as shown, each having an individual magnetization direction 1215. In alternative embodiments, the six magnets shown are the central six magnets in a larger assembly having the general configuration shown in FIG. 1. As will be seen, when in use, the front face 1270 of a pole piece 1210 is closest to a central sample volume or sample space 1230 and the rear face 1260 substantially generally conforms to the interior surface of the central cavity 1220 defined by the magnet array 1280.

It will be appreciated that in alternative embodiments the pole pieces may be in accordance with any other embodiments of the subject matter hereof.

In one series of embodiments of the ninth embodiment the pole pieces are comprised in a cage assembly according to the eighth embodiment.

In embodiments, a pole piece extends the entire length of the magnet array or the central cavity therein. In variant embodiments the pole piece extends for a distance that is longer than the magnet array or cavity therein. In other embodiments, a pole piece extends only a fraction of the length of the cavity or magnet array.

Symmetry Considerations

FIGS. 5, 6, 7 and 13 are generally referred to illustrate the symmetry aspects of the arrangement of shimming rods in embodiments. It will be seen that with adjustment of the positions of the shimming rods, the arrangement according to FIG. 5 can be adjusted to the arrangement according to FIG. 6. Similarly the shimming rods can be positioned so that opposed rods are inserted into the channel over equal distances, and adjacent rods are inserted into the channel over equal distances (the home position). Thus the system would exhibit reflection symmetry both end to end and side to side, hereafter referred to as the "home" position which is generally shown in FIG. 13 and is further explained below. In the "home" position the system as a whole may exhibit a set of symmetries, some of which may be eliminated when the shimming rods are moved out of the home position. In embodiments comprising more than one pole piece, additional symmetries may exist due to equivalence of the pole pieces' shapes, positions, orientations, or configuration of associated shimming rods. In that case, a home position for the system as a whole may require that corresponding shimming rods on multiple pole pieces be positioned or inserted with equalities of corresponding distances, as will be readily appreciated by those skilled in the art.

In embodiments, the symmetry elements exhibited by the embodiment when shimming rods are set to a home position together form a mathematical symmetry group. A suitable home position for shimming rods in an embodiment is now described with general reference to FIG. 13. Shimming rods 1393, 1394 are positioned within shimming holes 1383, 1384 in pole piece 1302. Shimming rods have proximal ends 1398, 1399 and these ends extend into the channel 1340 of the pole piece. When the distances of the ends 1398, 1399 from the channel's interior faces 1351, 1352, respectively, are all equal, the system as a whole exhibits its greatest symmetry, and the shimming rods are said to be in their home position. This symmetry can be broken by moving the shimming rods within the shimming holes so that said distances are no longer equal. In embodiments, geometrical components of magnetic field inhomogeneity can be associated with concerted motions of shimming rods, and these associations are governed by irreducible representations of said symmetry group. In embodiments, such associations guide or inform adjustments made to the positions of shimming rods in order to correct for inhomogeneity in a primary magnetic field.

In some embodiments, it is desirable to position pole pieces with respect to a sample volume in a manner so that the system as a whole exhibits symmetry. For example, in selected embodiments a pole piece according to an embodiment, itself exhibiting symmetry, is positioned on one side of a sample volume and another, identical pole piece is positioned on the side opposite to the first pole piece, in the manner illustrated generally in FIG. 12. It will be seen that the system exhibits a number of symmetry elements. In embodiments comprising shimming rods, alternative embodiments comprise shimming rods corresponding to holes in the pole pieces or positioned in such holes. In alternative embodiments shimming rods are omitted or are positioned close to pole pieces but not within corresponding holes in the pole pieces, as is illustrated in the embodiment of a pole piece assembly or central cage according to FIG. 7.

In FIG. 5, shimming rods 591,592 are positioned so that there is reflection symmetry side to side for the pole piece assembly, but not end to end. In FIG. 6 the shimming rods 694 are moved in concert to positions in which the system as a whole retains end to end reflection symmetry of the home positions but side to side reflection symmetry is lost.

Edge Rims

Illustrative variants of the conformation of edge rims according to variants of embodiments are generally described with reference to FIGS. 14A to 14L. In one variant shown in FIGS. 14A and B, and generally designated 1402, the edge rims 1404 each comprise a stepped recess or narrowed region 1406 on their inner face. In the alternative variant shown in FIGS. 14C and 14D and generally designated 1412 a graduated or curved recess or narrowed region 1416 is provided on the inner face of each rim 1414 and an abrupt transition in rim width is thus avoided. In the variant shown in FIGS. 14E and 14F, and generally designated 1422 the rims 1424 comprise a broadened, wider or thicker portion 1426.

FIG. 14G shows a texturing of the surface of rim 1434, and FIG. 14H is an enlarged view of region Y from FIG. 14G. Large perforations 1435 and small perforations 1437 are provided through the main rim structure 1434.

FIGS. 14I, J,K and L show a modified rim structure wherein a groove, slot or channel 1449 is provided in the main rim structure 1444, and is bounded at both ends by an unmodified rim region 1442. It will be understood that with regard to the foregoing narrowings and thickenings, texturing, structural or surface features, a range of variants are possible in embodiments and the position and length of the thickened or narrowed or textured or grooved or recessed region and the abruptness of the transition between different regions of the rim can all be adjusted as may be desired by the user to suit particular applications. The nature, implementation and application of all such adaptations will be readily understood and implemented by those skilled in the art to suit particular requirements.

Alternative Embodiments

In alternative embodiments shimming comprises adjusting the position of the shimming rod or shimming rods. In embodiments the shimming is carried out by mapping or modeling the magnetic field and adjusting the shimming rod or shimming rods in response to the map or model to achieve a desired field geometry. In embodiments the shimming is carried out by observing a magnetic resonance signal and adjusting the shimming rod or rods in response to characteristics of the signal, such as its strength or frequency distribution or phase distribution.

In embodiments shimming may comprise determining or adjusting the position of a shimming rod based on a simulation of the magnetic field to be shimmed or on parameters of a magnetic field extracted from a measured field map.

In embodiments there is disclosed the use of embodiments to generate, detect, measure or otherwise monitor magnetic resonance in a sample, all in ways that will be readily understood by those skilled in the art.

In alternative embodiments there are disclosed magnetic resonance apparatuses comprising embodiments, which magnetic resonance apparatuses will all be readily understood, constructed and operated by those skilled in the art. In alternative embodiments there is disclosed an NMR machine comprising the magnet arrays or pole pieces according to other embodiments. There is also disclosed the use of embodiments to shim a magnetic field, and the use of a positioner to position a pole piece for shimming a field. In a further series of embodiments there is disclosed a magnetic field shimmed using a pole piece according to an embodiment. In a further embodiment there is disclosed the use of a magnet array or a pole piece according to an embodiment to generate a magnetic resonance signal from a sample.

The embodiments and examples presented herein are illustrative and are not limiting. It will be understood by those skilled in the art how these embodiments can be readily combined, modified and/or adapted for various applications and in various ways without departing from the spirit and scope of the subject matter disclosed. The claims hereof are to be understood to include without limitation all alternative embodiments and equivalents of the subject matter hereof. Phrases, words and terms employed herein are illustrative and are not limiting. Where permissible by law, all references cited herein are incorporated by reference in their entirety. It will be appreciated that any aspects of the different embodiments disclosed herein may be combined in a range of possible alternative embodiments, and alternative combinations of features, all of which varied combinations of features are to be understood to form a part of the subject matter hereof.

The embodiments of the invention in which an exclusive property or privilege is claimed are defined as follows:

1. A pole piece for use in a Halbach-type assembly of permanent magnets, the pole piece comprising
   a rear face,
   a front face, and
   ends separated by a first distance defining a length of said pole piece, said pole piece being substantially elongated in shape along a first axis extending between said ends, wherein said pole piece is configured for insertion into the interior of the Halbach-type assembly along said first axis, and wherein said rear face defines at least one channel extending longitudinally along said first axis.

2. The pole piece according to claim 1 wherein said at least one channel extends for substantially all of said length.

3. The pole piece according to claim 1 comprising more than one said channel.

4. The pole piece according to claim 1 wherein said channel extends for a fraction of said length.

5. The pole piece according to claim 1 wherein said channel comprises a surface that:
   a) is substantially smooth; or
   b) is substantially ridged; or
   c) comprises at least one of protrusions and depressions.

6. The pole piece according to claim 1 comprising a positioner actuable to adjust the position of said pole piece.

7. The pole piece according to claim 1 wherein said pole piece further comprises a front face and said front face comprises:
   a) at least one ridge; or
   b) at least one groove; or
   c) at least one ridge and at least one groove.

8. The pole piece according to claim 1 wherein said pole piece is adapted to accept the insertion thereinto of at least one cooperating shimming rod.

9. The pole piece according to claim 8 further comprising at least one shimming rod.

10. The pole piece according to claim 9 wherein said pole piece comprises a female screw thread and said rod comprises a cooperating male screw thread so that the rod can be screwed into the pole piece.

11. The pole piece according to claim 7 wherein said pole piece is adapted to accept the insertion thereinto of at least one cooperating shimming rod.

12. A magnet array comprising at least one pole piece according to claim 1.

13. A magnet array comprising at least one pole piece according to claim 7.

14. A magnet array comprising at least one pole piece according to claim 8.

15. A method for modifying a magnetic field, the method comprising the step of using a pole piece adapted for use in a Halbach-based magnet design, said pole piece having an elongated shape and comprising a front face, and a rear face, and a channel provided in the rear face to modify the field.

16. The method according to claim 15, further comprising the step of adjusting at least one shimming rod, said adjustment based on:
   a) a simulation of said magnetic field or;
   b) parameters of said magnetic field extracted from a measured field map to thereby modify said magnetic field, said modification comprising shimming the magnetic field.

17. An apparatus for causing magnetic resonance in a sample, the apparatus comprising the pole piece according to claim 1.

18. The use of a pole piece according to claim 1 to shim a magnetic field.

19. The use of a pole piece according to claim 6 to shim a magnetic field, said shimming comprising using said positioner to position said pole piece.

20. A magnetic field shimmed using a pole piece according to claim 1.

21. The use of a pole piece according to claim 1 to cause magnetic resonance in a sample.

22. A magnetic resonance apparatus comprising a pole piece according to claim 1.

23. The pole piece according to claim 1, wherein the length is greater than a width dimension of the front face.

24. The pole piece according to claim 23, wherein the length is greater than a height dimension defining a second distance between the front face and the rear face.

25. The pole piece according to claim 23, wherein the length is greater than twice of the width dimension of the front face and greater than twice of a height dimension defining a second distance between the front face and the rear face.

26. A magnet assembly comprising permanent magnets arranged in a cylindrical Halbach configuration, said magnet assembly comprising a pole piece according to claim 1, wherein a channel longitudinal axis associated with the channel is parallel to a central longitudinal axis of the cylindrical Halbach configuration.

* * * * *